United States Patent [19]

Takeuchi

[11] Patent Number: 4,758,748
[45] Date of Patent: Jul. 19, 1988

[54] SENSE AMPLIFIER FOR PROGRAMMABLE READ ONLY MEMORY

[75] Inventor: Atsushi Takeuchi, Kawasaki, Japan

[73] Assignee: Fujitsu Limited, Kanagawa, Japan

[21] Appl. No.: 23,744

[22] Filed: Mar. 9, 1987

[30] Foreign Application Priority Data

Mar. 10, 1986 [JP] Japan ................. 61-050579

[51] Int. Cl.$^4$ ......................... H03K 17/693
[52] U.S. Cl. ................... 307/530; 307/360; 307/451; 365/189
[58] Field of Search ............... 307/443, 448, 451, 350, 307/530, 360; 365/184–185, 189, 196, 206

[56] References Cited

U.S. PATENT DOCUMENTS

| | | | |
|---|---|---|---|
| 4,179,626 | 12/1979 | Oehler | 365/207 X |
| 4,223,394 | 9/1980 | Pathak et al. | 365/207 X |
| 4,494,219 | 1/1985 | Tanaka et al. | 365/207 X |
| 4,565,932 | 1/1986 | Kuo et al. | 365/185 X |
| 4,599,707 | 7/1986 | Fang | 365/185 |
| 4,654,831 | 3/1987 | Venkatesh | 365/207 |
| 4,663,740 | 5/1987 | Ebel | 365/189 X |

FOREIGN PATENT DOCUMENTS 57-158090 9/1982 Japan .

Primary Examiner—Stanley D. Miller
Assistant Examiner—D. R. Hudspeth
Attorney, Agent, or Firm—Armstrong, Nikaido, Marmelstein & Kubovcik

[57] ABSTRACT

A sense amplifier for a programmable read only memory having a sense current source circuit for supplying memory cells in the memory with currents. The sense current source circuit is adapted to supply memory cells with a cell current for both a regular reading and a verify reading. A reference value of the cell current for the regular reading is selected to be higher than a reference value of the cell current for the verify reading, whereby a sufficient value of margin of voltage of a power source for the memory is ensured.

9 Claims, 5 Drawing Sheets

SENSE AMPLIFIER FOR PROGRAMMABLE READ ONLY MEMORY

BACKGROUND OF THE INVENTION

1. Field of the Invention

The present invention relates to a sense amplifier for a programmable read only memory such as an erasable programmable read only memory (EPROM).

2. Description of the Related Art

In general, a conventional EPROM includes a sense amplifier having a p-channel load transistor, an n-channel drive transistor, a sense output terminal, a memory cell array having a plurality of memory cell transistors, and bit lines and word lines. When a field effect transistor having a stacked-gate structure is used as a memory cell of an EPROM, the transistor injects and stores hot electrons, generated by an avalanche breakdown occurring at the drain terminal, into a floating gate during a program operation, so that the changes in threshold voltage Vth of the transistor are utilized.

In the EPROM which uses the field effect transistor having a stacked-gate structure, since an electric charge is stored in the floating gate of the program, i.e., written, memory cell transistor as described above, it is difficult to pass a drain current, i.e., a cell current, therethrough. Therefore, when data is read in such a case, the potential of the sense output is HIGH level "1". Conversely, since an electric charge is not stored in the floating gate of the non-programmed memory cell transistor, it is easy to flow a cell current therethrough. Therefore, when data is read in such a case, the potential of the sense output is LOW level "0".

In order to program, i.e., write in, the EPROM which uses the field effect transistor having the stacked-gate structure, a power supply voltage $V_{pp}$ for programming is applied to the memory. The power supply voltage $V_{pp}$ for programming is, for example, 12 V, which is a higher value than a power supply voltage $V_{cc}$ for reading (for example, 5 V). In this case, a voltage of about 10 V is applied between the drain and the source of the cell transistor, and a voltage of about 12 V is applied to a control gate electrode at the surface. Note that, during a verify read operation, the power supply voltage $V_{pp}$ for programming is applied to the memory, and the power supply voltage $V_{cc}$ for reading is applied to the memory cell transistor and other necessary sections by a suitable switch circuit, but during a regular read operation, only the power supply voltage $V_{cc}$ for reading is applied to the memory.

In the above-mentioned EPROM, the completion of a write operation is verified by detecting whether the sense current exceeds the reference value. That is, the voltage $V_{pp}$ for programming is applied to carry out the write operation as described above. The power supply voltage $V_{cc}$ for reading is switched and applied to carry out the verify reading operation while the power supply voltage $V_{pp}$ for programming is still applied. If a cell current exceeding the reference value does not flow in the memory cell transistor, the write operation is determined to be completed.

During the above verify reading, the power supply voltage $V_{pp}$ for programming of, for example, 12 V, and the power supply voltage $V_{cc}$ for reading of, for example, 5 V, are applied to the memory, and the power supply voltage $V_{cc}$ for reading is applied to the memory cell transistor 51. Assuming that the power supply voltage $V_{cc}$ for reading is, for example, 5 V, a voltage of 5 V is applied to the control gate electrode at the surface of the memory cell transistor, and a voltage of about 1 V is applied between the drain and the source.

The reference value of the cell current for carrying out a discrimination between "1" and "0" in the case of the verify reading is the same as that in the case of the regular reading.

In the case of programming the above EPROM, when the reference value of the cell current for discriminating whether the write operation is completed is set, for example, as 10 µA, the write operation is determined to be completed if the cell current is, for example, 9 µA, during the verify reading.

However, after long-term use of the memory, often the electric charges will leak from the floating gate of the memory cell transistor. As a result, the cell current increases by an amount of, for example, 1 µA.

Under such a condition, when the regular read operation is performed and a cell current of 10 µA flows, it is recognized that the potential of the sense output is LOW level "0", although the potential of the sense output should be recognized as being HIGH level "1". Hence, the discrimination between "1" and "0" in the regular reading becomes incorrect. Therefore, the operation of the EPROM can become defective.

SUMMARY OF THE INVENTION

It is an object of the present invention to provide an improved sense amplifier for a programmable read only memory, in which the margin of the voltage of the power source, which is the difference between the voltage for normal operation and that for defective operation of the device, is sufficiently ensured, so that HIGH and LOW levels of the potential of the sense output are correctly discriminated even if there is a leakage of the electric charge injected in the floating gate.

In accordance with the present invention, there is provided a sense amplifier for a programmable read only memory having a sense current source circuit for supplying memory cells in the memory with currents, the sense current source circuit being adapted to supply memory cells with a cell current for both a regular reading and a verify reading. In this device, a reference value of the cell current for the regular reading is selected to be higher than a reference value of the cell current for the verify reading, whereby a sufficient value of margin of voltage of a power source for the memory is ensured.

DESCRIPTION OF THE PREFERRED EMBODIMENTS

Before describing preferred embodiments of the present invention, a conventional sense amplifier of an EPROM will be described with reference to FIG. 1.

Figure 1:
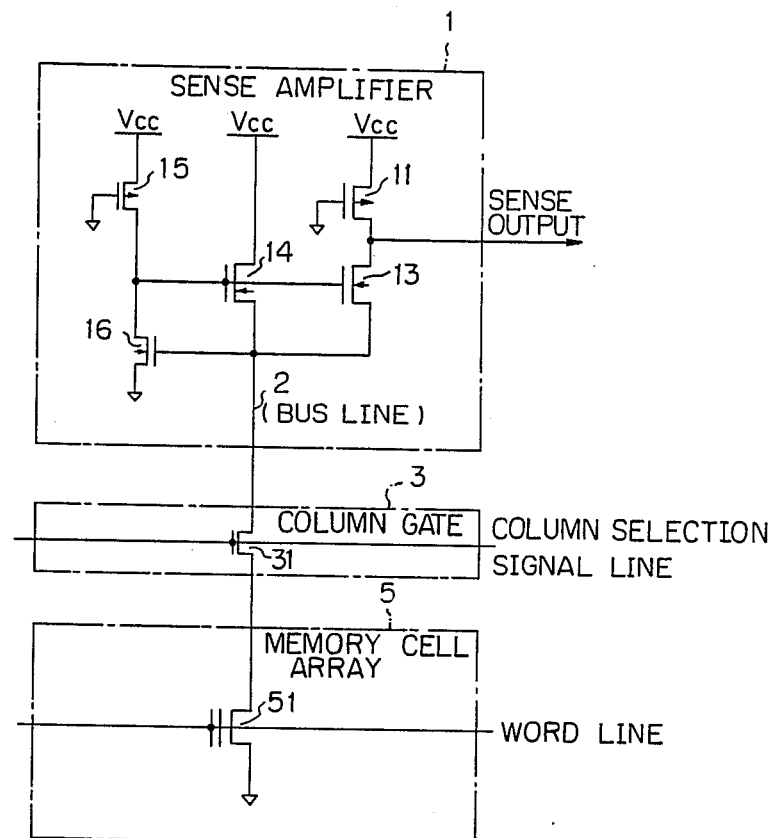
FIG. 1 is a circuit diagram of the fundamental structure of a conventional sense amplifier of an EPROM.

The device shown in FIG. 1 is provided with a sense amplifier 1, a p-channel load transistor 11, an n-channel drive transistor 13, a sense output terminal, a memory cell transistor 51, and a word line WL.

In FIG. 1, the memory cell transistor 51 is a so-called field effect transistor having a stacked-gate structure. During a write operation, the memory cell transistor 51 injects and stores hot electrons, generated by avalanche breakdown occurring at the drain terminal, to a floating gate, thereby utilizing changes in the threshold voltage $V_{th}$ of the transistor 51.

In the EPROM shown in FIG. 1, since an electric charge is stored in the floating gate of the programmed, i.e., written, memory cell transistor 51, it is difficult for a drain current, i.e., a cell current to flow therethrough. Therefore, when data is read out in such a case, the potential of the sense output is HIGH level "1". Conversely, since an electric charge is not stored in the floating gate of the non-programmed memory cell transistor, it is easy for a cell current to flow therethrough. Therefore, when data is read in such a case, the potential of the sense output is LOW level "0".

In order to program, i.e., to write in, the EPROM which uses the field effect transistor having the stacked-gate structure, a power supply voltage $V_{pp}$ for programming is applied to the memory. The power supply voltage $V_{pp}$ for programming is, for example, 12 V, which is a higher value than a power supply voltage $V_{cc}$ for reading of, for example, 5 V. In this case, a voltage of about 10 V is applied between the drain and the source of the cell transistor, and a voltage of about 12 V is applied to a control gate electrode at the surface. Note that, during program verification, the power supply voltage $V_{pp}$ for programming is applied to the memory, and the power supply voltage $V_{cc}$ for reading is applied to the memory cell transistor and other necessary sections by a suitable switch circuit. In addition, during a regular read operation, only the power supply voltage $V_{cc}$ for reading is applied to the memory.

A sense amplifier for an EPROM as a preferred embodiment of the present invention will now be described with reference to FIGS. 2 and 3. The fundamental structure is shown in FIG. 2, and a detailed circuit diagram is shown in FIG. 3.

Figure 2:
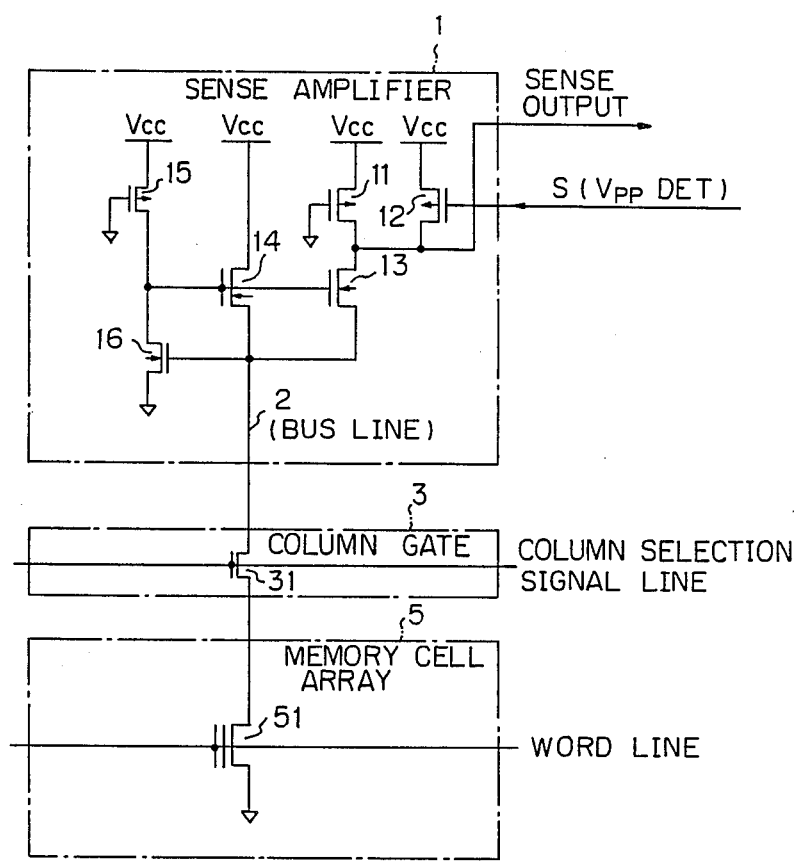
FIG. 2 is a circuit diagram of the fundamental structure of an EPROM according to an embodiment of the present invention.
Figure 3:
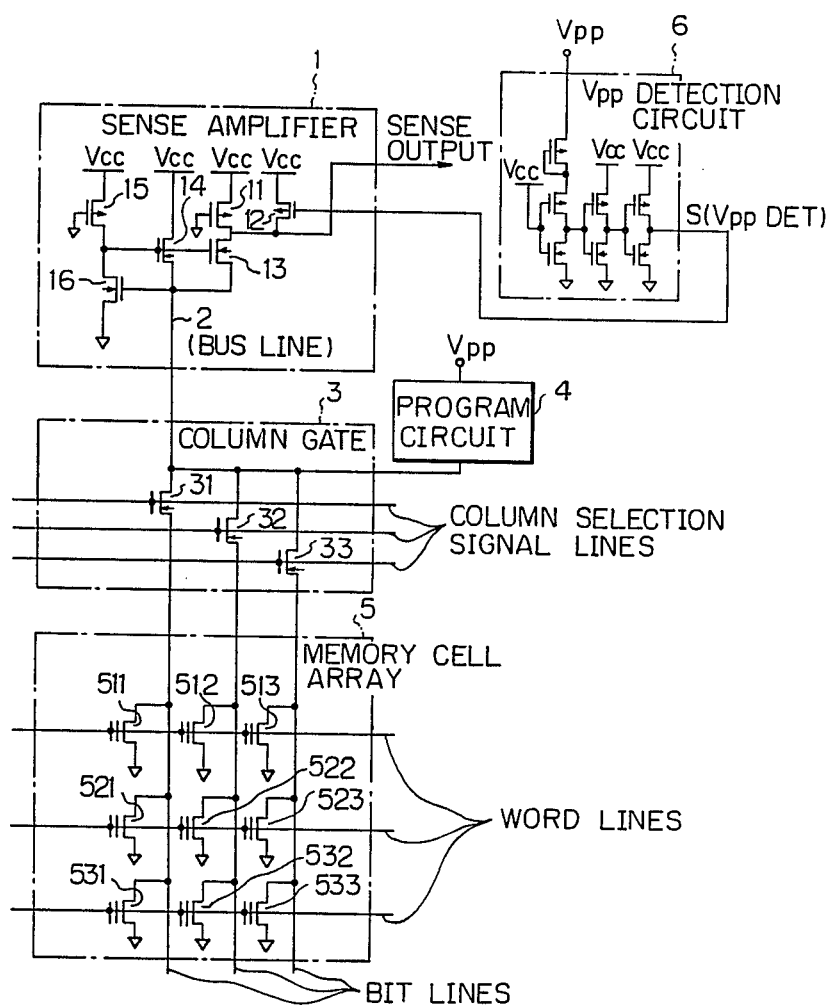
FIG. 3 is a detailed circuit diagram of the EPROM shown in FIG. 2.

In a device shown in FIGS. 2 and 3, a transistor 12, which is a p-channel type as for the transistor 11, is connected, as an additional load transistor, in parallel with the transistor 11.

The load transistor 12 is OFF during the verify reading and is ON during a regular read operation.

Therefore, if the load transistors 11 and 12 have the same ability, a load current drive ability during the regular read operation is twice that for the verify read operation.

In general, whether the sense output is "1" or "0" depends on the ratio between the current drive ability in the load side and that in the memory cell side, i.e., depends on which of these current drive abilities is higher.

More specifically, when the load current drive ability is higher than the memory cell current drive ability, sufficient current cannot flow from the load side to the memory cell side, so that the potential of the sense output is HIGH level. In the reverse case, the potential of the sense output is LOW level.

Therefore, during the verify reading operation, only the load transistor 11 is turned ON to reduce the current drive ability and thus reduce the sense current. Whether the write operation is completed is discriminated by setting a reference value of, for example, 10 μA, as described above. During the regular reading, the load transistor 12, in addition to the load transistor 11, is turned ON to increase the current drive ability and thus increase the sense current, thereby discriminating whether the value is "1" or "0" by setting a reference value of, for example, 20 μA.

In this manner, even if there is a slight leakage of the electric charge stored in the memory cell transistor 51, correct 37 1" or "0" data is obtained as the sense output.

FIG. 3 shows a verify reading/regular reading discrimination signal $S(V_{pp}DET)$, a bus line 2, a power supply voltage $V_{pp}$ for a $V_{pp}$ detection circuit 6, a program circuit 4, a column gate 3, a column selection signal lines, a memory cell array 5, word lines, and bit lines.

In the regular reading, the voltage $V_{cc}$ of 5 volt is applied to the terminal of the $V_{pp}$ detection circuit 6 so that the voltage of the $S(V_{pp}DET)$ is 0 volt. In the verify reading, the voltage $V_{pp}$ of 12 volt is applied to the $V_{pp}$ terminal of the $V_{pp}$ detection circuit 6 so that the voltage of the $S(V_{pp}DET)$ is equal to $V_{cc}$.

In FIG. 3, during the regular reading operation, $S(V_{pp}DET)=0$ V, and the load of the sense amplifier 1 is the transistors 11 and 12. To the contrary, during the verify reading, $S(V_{pp}DET)=V_{cc}$, and the load transistor 12 is turned OFF. Therefore, the load of the sense amplifier 1 is only the transistor 11. Thus, the magnitude of the load during the verify reading is different from that during the regular reading, so that the magnitude of the sense current can be changed.

According to the device shown in FIG. 2, a small sense current can flow during the verify reading, and the reference value of the cell current, for discriminating whether the write operation is completed, is set at a small value so as to ensure the verification of the completion of the programming. Conversely, a large sense current can flow during the regular reading, and the reference value of the sense current for discriminating whether "1" or "0" is set at a large value so as to perform the regular read operation. Therefore, a sufficient margin of the voltage of the power source is ensured to enhance the reliability of the discrimination of information.

Figure 4:
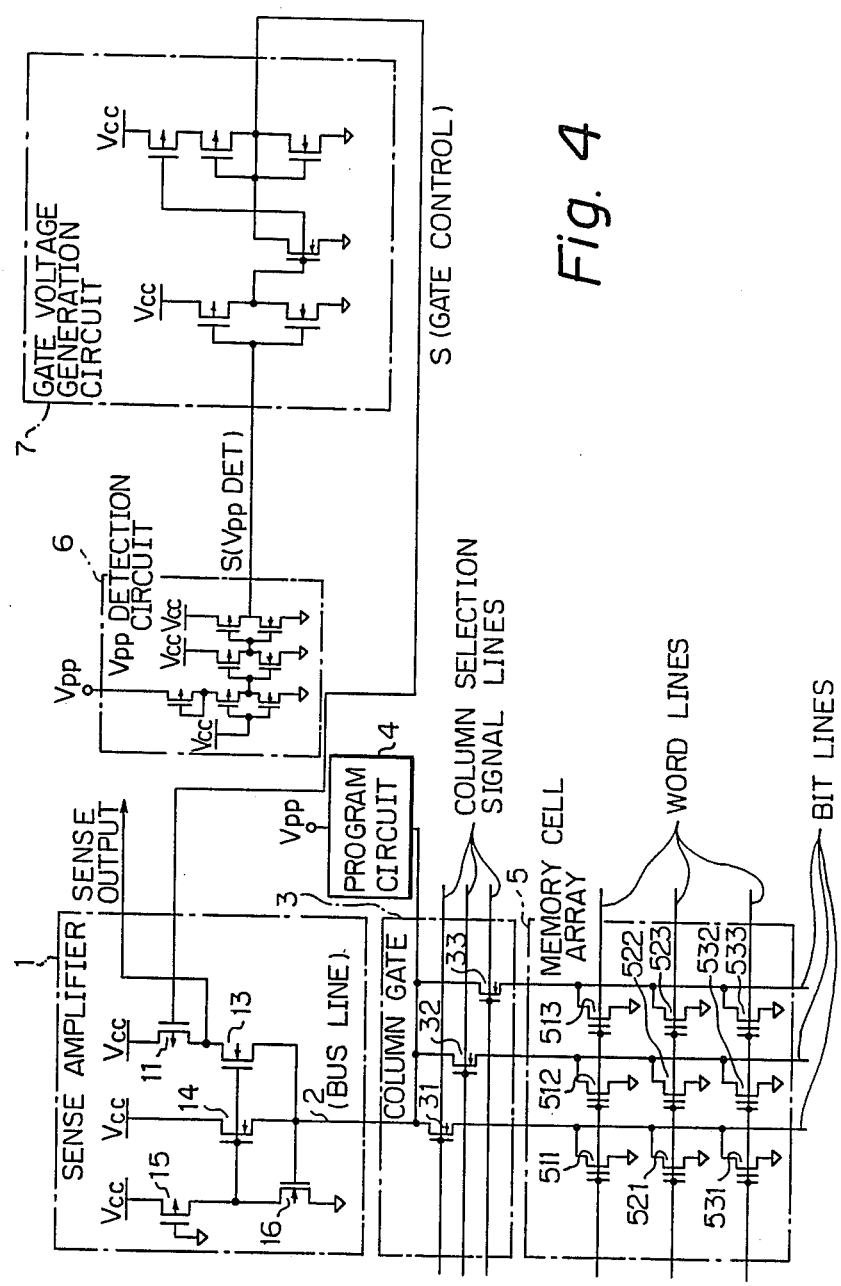
FIG. 4 is a circuit diagram of an EPROM according to another embodiment of the present invention.

FIG. 4 shows another embodiment of the present invention.

In FIG. 4, a gate control signal S(GATE CONTROL) is delivered from a gate voltage generator 7.

In a device shown in FIG. 4, the verify read/regular read operation discrimination signal $S(V_{pp}DET)$ is input to the gate voltage generator 7. In response to the signal $S(V_{pp}DET)$, the gate voltage generator 7 generates and applies the gate signal S(GATE CONTROL) to the gate of the load transistor 11. In this case, only the transistor 11 serves as the load transistor.

When $S(V_{pp}DET)=0$ V, S(GATE CONTROL)=0 V, and when $S(V_{pp}DET)=V_{cc}$, S(GATE CONTROL) is at an intermediate level between $V_{cc}$ and 0 V. As a result, conductance of the transistor 11 varies to change the ability for flowing the current. Accordingly, the magnitude of the sense current during the verify read operation can be changed from that during the regular read operation.

Figure 5:
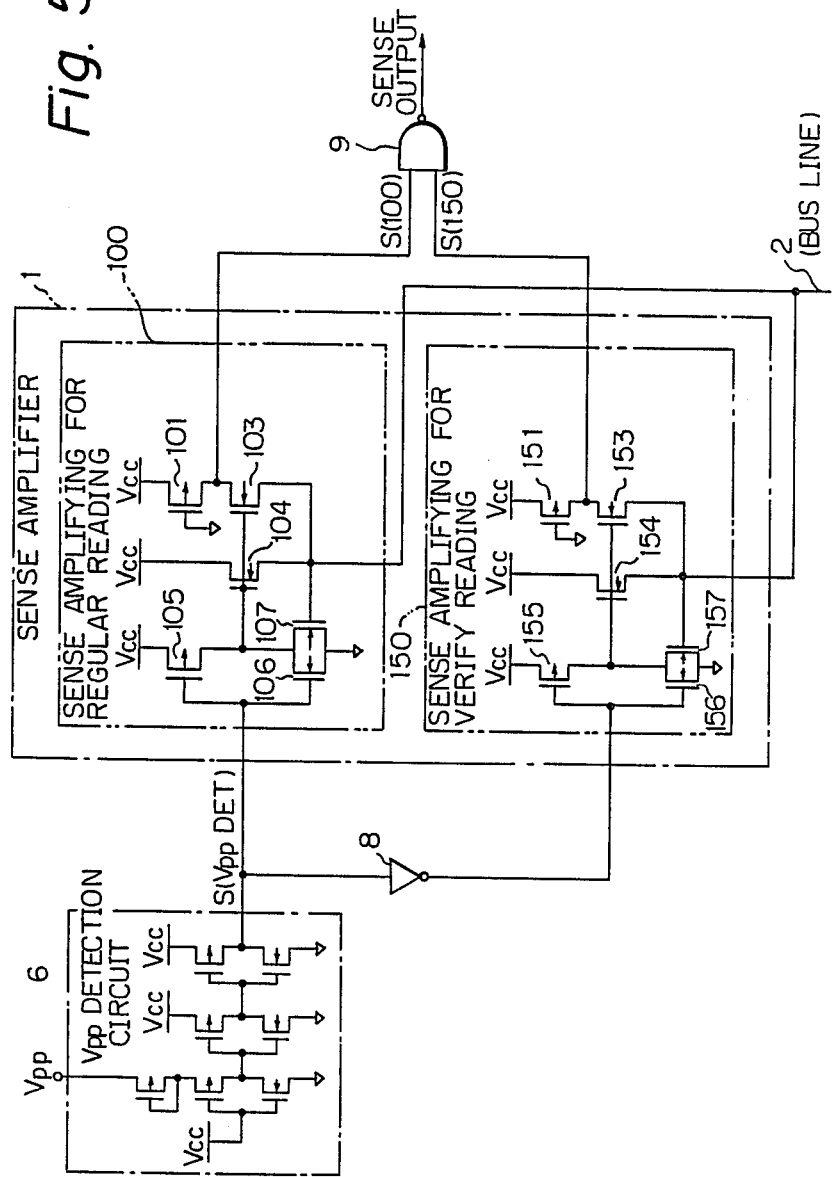
FIG. 5 is a circuit diagram of an EPROM according to still another embodiment of the present invention.

FIG. 5 shows still another embodiment of the present invention. FIG. 5 shows a regular reading sense amplifying section 100, a sense output S(100) of the regular reading sense amplifying section 100, a verify reading sense amplifying section 150, and a sense output S(150) of the verify reading sense amplifying section 150.

In the sense amplifier 1 of a device shown in FIG. 5, a channel width/channel length ratio W/L of the load transistor 101 of the regular reading sense amplifying section 100 is different from that of the load transistor 151 of the verify reading sense amplifying section 150, i.e., the transistor 101 is larger than the transistor 151. Thus, the sense amplifying sections 100 and 150 in the sense amplifier 1 are switched to be selectively used during the regular reading and during the verify reading. The sense output S(100) or S(150) of the selected section is output as the sense output through the NAND gate 9. Therefore, according to the device shown in FIG. 5, the magnitude of the sense current during the verify reading can be changed from that during the regular reading.

I claim:

1. A sense amplifier for a programmable read only memory having a sense current source circuit connected to supply memory cells with a cell circuit for both a regular reading and a verify reading, said sense current source circuit receiving a signal indicating a verify reading and controlling the cell current,
    wherein a reference value of the cell current for the regular reading is selected to be higher than a reference value of the cell current for the verify reading.

2. A sense amplifier according to claim 1, wherein said sense current source circuit is connectable to control the change the value of current output from said sense current source.

3. A sense amplifier according to claim 2, wherein said switching of a current value is carried out by connecting or disconnecting a second transistor in parallel with a first transistor in said sense current source circuit.

4. A sense amplifier according to claim 3, wherein said connecting or disconnecting of the second transistor is carried out by a control signal supplied to said second transistor in correspondence with a power source voltage ($V_{pp}$) for programming the memory cell.

5. A sense amplifier according to claim 2, wherein said control of the current value change is carried out by controlling the gate voltage of a transistor in said sense current source circuit.

6. A sense amplifier according to claim 1, wherein sense amplifier consists of a sense amplifying wherein sense amplifier consists of a sense amplifying portion for regular reading, and a sense amplifying portion for verify reading, and said regular reading sense amplifying portion and said verify reading sense amplifying portion are switchable therebetween, wherein said regular reading, and said verify reading sense amplifying portion is selected in the verify reading. therebetween.

7. A sense amplifier according to claim 1, further comprising a detection circuit for detecting an application of a programming voltage to the memory and generating a detection signal for controlling said sense current source circuit.

8. A sense amplifier according to claim 7, wherein said sense current source circuit includes a first transistor which is always turned ON and a second transistor, connected to the first transistor in parallel, which is turned ON during the regular reading and turned OFF during the verify reading by the detection signal.

9. A sense amplifier according to claim 7, further comprising a gate voltage generation circuit, connected to the detection circuit, for generating a gate voltage, wherein said current source circuit includes a transistor haivng a gate connected to the gate voltage generation circuit and the gate voltage is controlled so that a conductance of the transistor during the regular reading is larger than a conductance of the transistor during the verify reading.

* * * * *